US012088261B2

(12) United States Patent
Song et al.

(10) Patent No.: US 12,088,261 B2
(45) Date of Patent: Sep. 10, 2024

(54) NON-LINEAR FEEDBACK CIRCUIT AND LOW-NOISE AMPLIFIER USING THE SAME

(71) Applicant: NanJing Milliway Microelectronics Technology Co., LTD., Jiangsu (CN)

(72) Inventors: Jiaying Song, Jiangsu (CN); Yifan Jiang, Jiangsu (CN)

(73) Assignee: NanJing Milliway Microelectronics Technology Co., LTD., Nanjing (CN)

( * ) Notice: Subject to any disclaimer, the term of this patent is extended or adjusted under 35 U.S.C. 154(b) by 540 days.

(21) Appl. No.: 17/296,457

(22) PCT Filed: Oct. 22, 2019

(86) PCT No.: PCT/CN2019/112620
§ 371 (c)(1),
(2) Date: May 24, 2021

(87) PCT Pub. No.: WO2020/134417
PCT Pub. Date: Jul. 2, 2020

(65) Prior Publication Data
US 2021/0399696 A1 Dec. 23, 2021

(30) Foreign Application Priority Data
Dec. 26, 2018 (CN) .......................... 201811601417.8

(51) Int. Cl.
H03F 1/30 (2006.01)
H03F 1/32 (2006.01)
H03F 3/21 (2006.01)

(52) U.S. Cl.
CPC .............. *H03F 3/21* (2013.01); *H03F 1/30* (2013.01); *H03F 1/3247* (2013.01)

(58) Field of Classification Search
CPC . H03F 3/21; H03F 1/30; H03F 1/3247; H03F 2200/126; H03F 2200/294; H03F 2200/447; H03F 1/301; H03F 1/3276
USPC .......................................................... 330/295
See application file for complete search history.

(56) References Cited

U.S. PATENT DOCUMENTS

| 6,459,340 B1 * | 10/2002 | Apel | .................. | H03K 17/0826 |
| | | | | 330/207 P |
| 7,123,096 B2 * | 10/2006 | Selin | ..................... | H03F 1/0288 |
| | | | | 330/295 |
| 8,970,308 B2 * | 3/2015 | Wilson | ..................... | H03H 7/38 |
| | | | | 330/253 |

(Continued)

FOREIGN PATENT DOCUMENTS

| CN | 101454972 A | 6/2009 |
| CN | 101610068 A | 12/2009 |

(Continued)

*Primary Examiner* — Andrea Lindgren Baltzell
*Assistant Examiner* — Khiem D Nguyen

(57) ABSTRACT

The invention discloses a nonlinear feedback circuit, which includes at least one diode. The invention also discloses a low noise amplifier using the nonlinear feedback circuit. In the invention, temperature compensation is performed for the gain change of the low noise amplifier based on the negative temperature characteristics of the diode, thereby achieving gain stability. In addition, the nonlinear characteristics of the diode can also provide high-order harmonics for the low-noise amplifier, and the mutual cancellation and addition of high-order harmonics can increase the OIP3 of the low noise amplifier.

6 Claims, 4 Drawing Sheets

(56) References Cited

U.S. PATENT DOCUMENTS

| | | | | |
|---|---|---|---|---|
| 11,025,205 B2 * | 6/2021 | Kuwata | ................... | H03F 1/223 |
| 2005/0237110 A1 * | 10/2005 | Parkhurst | ............. | H03G 3/3042 |
| | | | | 330/140 |

FOREIGN PATENT DOCUMENTS

| CN | 109450395 A | 3/2019 |
|---|---|---|
| CN | 209375591 U | 9/2019 |
| JP | 2001110993 A | 4/2001 |

\* cited by examiner

NON-LINEAR FEEDBACK CIRCUIT AND LOW-NOISE AMPLIFIER USING THE SAME

BACKGROUND

Technical Field

The invention relates to a low noise amplifier, and in particular, to a nonlinear feedback circuit and a low noise amplifier using same.

Related Art

Nowadays, with the continuous increase in market demand, amplifier chips are often used at various different ambient temperatures. However, the characteristics of a pseudomorphic high electron mobility transistor (pHemt) change to a certain extent with different ambient temperatures, leading to a great fluctuation of the amplifier gain. Generally, a small signal gain fluctuation is 1-3 dB. A common voltage divider power supply method will cause the gain of the amplifier to change greatly under temperature changes. When a power amplifier operates in a saturated state and at a high bias point, the current decreases as the temperature increases. In the prior art, for an enhancement-mode pHemt, generally a current mirror is used to achieve temperature compensation, but such a temperature compensation circuit is often only suitable for power amplifiers and not for low noise amplifiers.

SUMMARY

Object of the invention: It is an object of the invention to provide a nonlinear feedback circuit and a low-noise amplifier using same, which can solve the problem in the prior art that the temperature compensation circuit is not suitable for low noise amplifiers.

Technical solutions: To achieve this object, the following technical solutions are adopted in the invention.

The nonlinear feedback circuit of the invention includes at least one diode, where when there is only one diode, a cathode of the diode is configured to connect to a gate of an enhancement-mode pseudomorphic high electron mobility transistor (pHemt) Q1 in a low noise amplifier, and an anode of the diode is configured to connect to a drain of the enhancement-mode pHemt Q1 in the low noise amplifier; and when there are two or more diodes, all the diodes are connected in series, where an anode of a first diode is configured to connect to the drain of the enhancement-mode pHemt Q1 in the low noise amplifier, a cathode of the first diode is configured to connect to an anode of a second diode, and a cathode of a last diode is configured to connect to the gate of the enhancement-mode pHemt Q1 in the low noise amplifier.

Further, the nonlinear feedback circuit further includes a first resistor R1, where one end of the first resistor R1 is configured to connect to the cathode of the diode when there is only one diode; one end of the first resistor R1 is configured to connect to the cathode of the last diode when there are two or more diodes; and an other end of the first resistor R1 is configured to be grounded. In this way, the negative temperature characteristics of the diode and the positive temperature characteristics of the first resistor R1 can be combined in a complementary fashion, to avoid the problem that it is difficult to reach a suitable temperature by compensation when only the diode is used. In addition, $P1dB$ can be increased.

Further, the nonlinear feedback circuit further includes a second resistor R2, where when there is only one diode, the second resistor R2 is connected in series with the diode, one end of the series circuit consisting of the second resistor R2 and the diode is configured to connect to the drain of the enhancement-mode pHemt Q1 in the low noise amplifier, and an other end of the series circuit consisting of the second resistor R2 and the diode is configured to connect to the gate of the enhancement-mode pHemt Q1 in the low noise amplifier; and when there are two or more diodes, the second resistor R2 is connected in series with all the diodes, and one end of the series circuit consisting of the second resistor R2 and all the diodes is configured to connect to the drain of the enhancement-mode pHemt Q1 in the low noise amplifier, and an other end of the series circuit consisting of the second resistor R2 and all the diodes is configured to connect to the gate of the enhancement-mode pHemt Q1 in the low noise amplifier. In this way, the negative temperature characteristics of the diode and the positive temperature characteristics of the second resistor R2 can be combined in a complementary fashion, to avoid the problem that it is difficult to reach a suitable temperature by compensation when only the diode is used. In addition, $P1dB$ can be increased.

Further, the nonlinear feedback circuit further includes a third resistor R3 and a first inductor L1, where when there is only one diode, one end of the third resistor R3 is configured to connect to the cathode of the diode, and one end of the first inductor L1 is configured to connect to the anode of the diode; when there are two or more diodes, one end of the third resistor R3 is configured to connect to the cathode of the last diode, and one end of the first inductor L1 is configured to connect to the anode of the first diode; and an other end of the third resistor R3 is configured to connect to the gate of the enhancement-mode pHemt Q1 in the low noise amplifier, and an other end of the first inductor L1 is configured to connect to the drain of the enhancement-mode pHemt Q1 in the low noise amplifier. The third resistor R3 can form a high-impedance state to prevent a DC signal from being coupled to the radio frequency end. With the first inductor L1, the inductance of L1 can be used to prevent a DC signal from being coupled to the radio frequency.

Further, the nonlinear feedback circuit further includes a first capacitor C1 and a second capacitor C2, where when there is only one diode, one end of the first capacitor C1 is configured to connect to the anode of the diode, and one end of the second capacitor C2 is configured to connect to the cathode of the diode; when there are two or more diodes, one end of the first capacitor C1 is configured to connect to the anode of the first diode, and one end of the second capacitor C2 is configured to connect to the cathode of the last diode; and an other end of the first capacitor C1 and an other end of the second capacitor C2 are both configured to be grounded. In this way, the first capacitor C1 and the second capacitor C2 can filter out the current coupled from the DC end to the radio frequency end.

The low noise amplifier using the nonlinear feedback circuit of the invention includes an enhancement-mode pseudomorphic high electron mobility transistor (pHemt) Q1, where a gate of the enhancement-mode pHemt Q1 is configured to connect to at least one diode: when there is only one diode, a cathode of the diode is connected to the gate of the enhancement-mode pHemt Q1, and an anode of the diode and a drain of the enhancement-mode pHemt Q1 are both connected to one end of a voltage source DC1; when there are two or more diodes, an anode of a first diode and the drain of the enhancement-mode pHemt Q1 are both configured to connect to one end of the voltage source DC1, a cathode of the first diode is configured to connect to an anode of a second diode, and a cathode of a last diode is configured to connect to the gate of the enhancement-mode pHemt Q1; and a source of the enhancement-mode pHemt Q1 and an other end of the voltage source DC1 are both configured to be grounded.

Further, the nonlinear feedback circuit further includes a first resistor R1, where one end of the first resistor R1 is configured to connect to the cathode of the diode when there is only one diode; one end of the first resistor R1 is configured to connect to the cathode of the last diode when there are two or more diodes; and an other end of the first resistor R1 is configured to be grounded. In this way, the negative temperature characteristics of the diode and the positive temperature characteristics of the first resistor R1 can be combined in a complementary fashion, to avoid the problem that it is difficult to reach a suitable temperature by compensation when only the diode is used. In addition, P1$d$B can be increased.

Further, the nonlinear feedback circuit further includes a second resistor R2, where when there is only one diode, the second resistor R2 is connected in series with the diode, one end of the series circuit consisting of the second resistor R2 and the diode is configured to connect to the drain of the enhancement-mode pHemt Q1 in the low noise amplifier, and an other end of the series circuit consisting of the second resistor R2 and the diode is configured to connect to the gate of the enhancement-mode pHemt Q1 in the low noise amplifier; and when there are two or more diodes, the second resistor R2 is connected in series with all the diodes, and one end of the series circuit consisting of the second resistor R2 and all the diodes is configured to connect to the drain of the enhancement-mode pHemt Q1 in the low noise amplifier, and an other end of the series circuit consisting of the second resistor R2 and all the diodes is configured to connect to the gate of the enhancement-mode pHemt Q1 in the low noise amplifier. In this way, the negative temperature characteristics of the diode and the positive temperature characteristics of the second resistor R2 can be combined in a complementary fashion, to avoid the problem that it is difficult to reach a suitable temperature by compensation when only the diode is used. In addition, P1$d$B can be increased.

Further, the nonlinear feedback circuit further includes a third resistor R3 and a first inductor L1, where when there is only one diode, one end of the third resistor R3 is configured to connect to the cathode of the diode, and one end of the first inductor L1 is configured to connect to the anode of the diode; when there are two or more diodes, one end of the third resistor R3 is configured to connect to the cathode of the last diode, and one end of the first inductor L1 is configured to connect to the anode of the first diode; and an other end of the third resistor R3 is configured to connect to the gate of the enhancement-mode pHemt Q1, and an other end of the first inductor L1 is configured to connect to the drain of the enhancement-mode pHemt Q1. The third resistor R3 can form a high-impedance state to prevent a DC signal from being coupled to the radio frequency end. With the first inductor L1, the inductance of L1 can be used to prevent a DC signal from being coupled to the radio frequency.

Further, the nonlinear feedback circuit further includes a first capacitor C1 and a second capacitor C2, where when there is only one diode, one end of the first capacitor C1 is configured to connect to the anode of the diode, and one end of the second capacitor C2 is configured to connect to the cathode of the diode; when there are two or more diodes, one end of the first capacitor C1 is configured to connect to the anode of the first diode, and one end of the second capacitor C2 is configured to connect to the cathode of the last diode; and an other end of the first capacitor C1 and an other end of the second capacitor C2 are both configured to be grounded. In this way, the first capacitor C1 and the second capacitor C2 can filter out the current coupled from the DC end to the radio frequency end.

Beneficial effects: The invention discloses a nonlinear feedback circuit and a low noise amplifier using same, where temperature compensation is performed for the enhancement-mode pHemt Q1 in the low noise amplifier based on the negative temperature characteristics of the diode, thereby achieving gain stability. In addition, the nonlinear characteristics of the diode can also provide high-order harmonics for the low-noise amplifier, and the mutual cancellation and addition of high-order harmonics can increase the OIP3 of the low noise amplifier.

DETAILED DESCRIPTION

The technical solutions of the present invention will be further described in detail below with reference to specific embodiments and the accompanying drawings.

Figure 1:
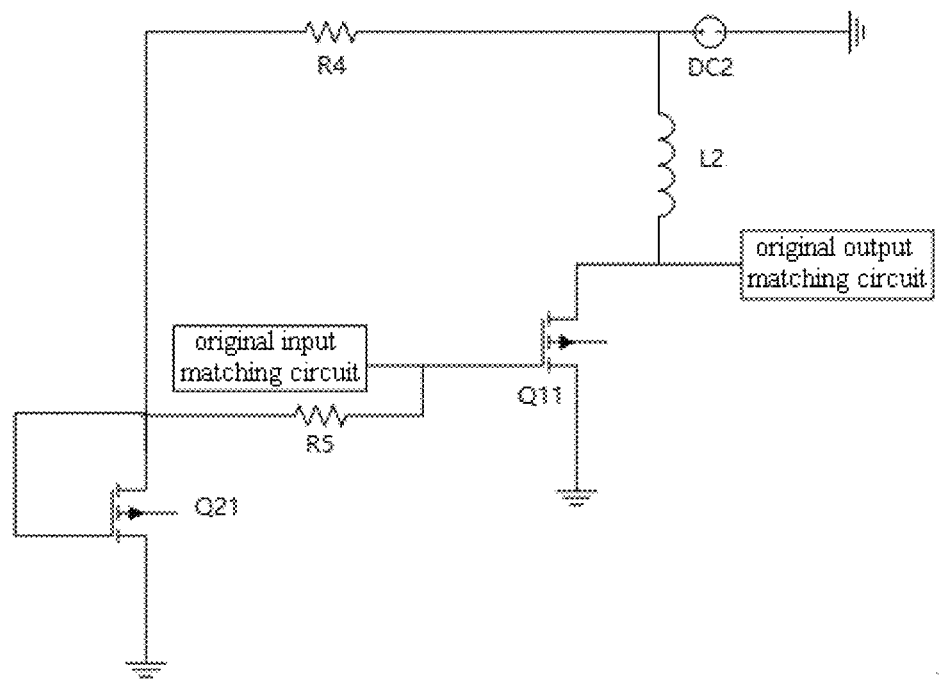
FIG. 1 is a circuit diagram of a power amplifier adopting a temperature compensation circuit in the prior art.

FIG. 1 is a circuit diagram of a power amplifier adopting a temperature compensation circuit in the prior art. The temperature compensation circuit can make the change state of an enhancement-mode pHemt Q21 consistent with that of an enhancement-mode pHemt Q11. When the temperature increases, the current of the enhancement-mode pHemt Q21 decreases, and the partial voltage on a fourth resistor R4 decreases. In this case, Vds and Vgs of the enhancement-mode pHemt Q21 increase, which will increase the current of the enhancement-mode pHemt Q21 in turn, making the current of the enhancement-mode pHemt Q21 remain unchanged at high and low temperatures. At the same time, the current of the enhancement-mode pHemt Q11 also remains unchanged as Vgs of the enhancement-mode pHemt Q11 increases. However, the temperature compensation circuit in the prior art cannot be used in a low noise amplifier, because the use of the temperature compensation circuit in a low noise amplifier will lead to a greater deviation between high and low temperatures and a worse effect.

Figure 2:
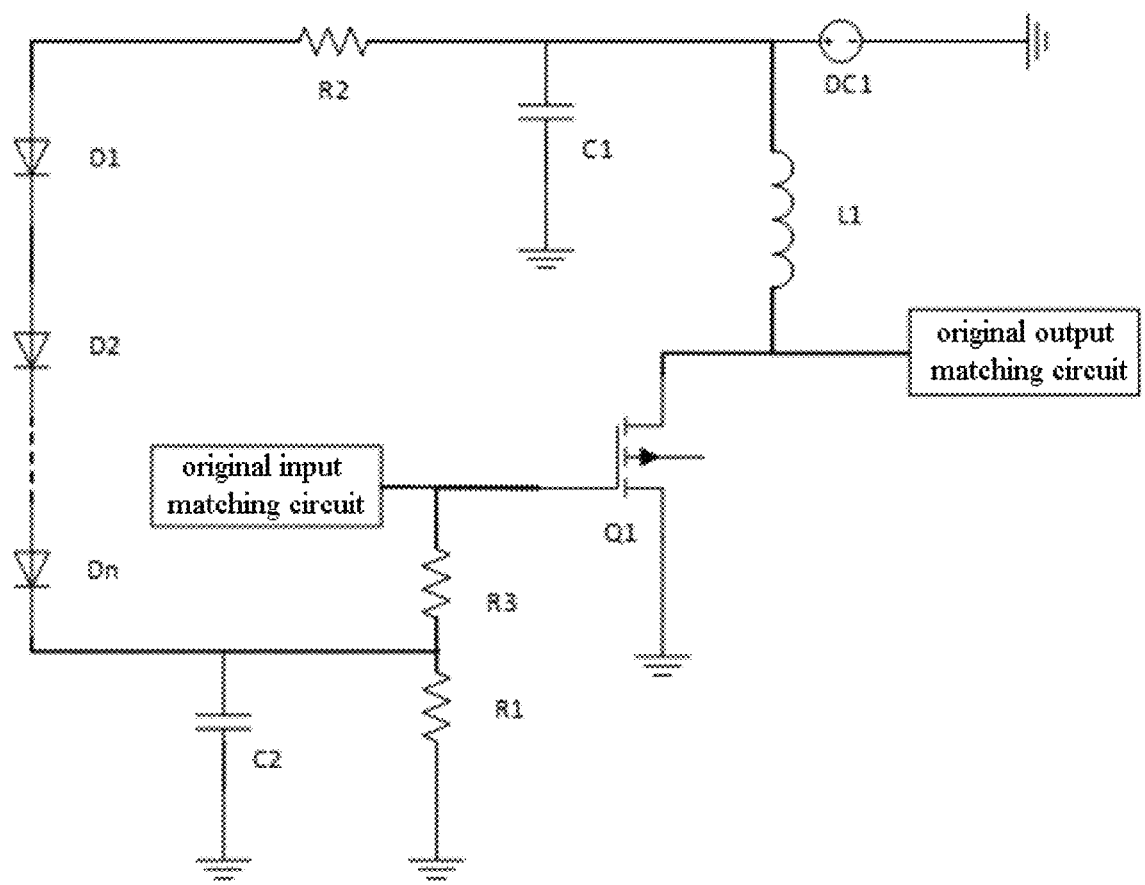
FIG. 2 is a circuit diagram of a low noise amplifier in a specific embodiment of the invention.

Therefore, a specific implementation of the invention discloses a nonlinear feedback circuit, which, as shown in FIG. 2, includes at least one diode. When there is only one diode, a cathode of the diode is configured to connect to a gate of an enhancement-mode pseudomorphic high electron mobility transistor (pHemt) Q1 in a low noise amplifier, and an anode of the diode is configured to connect to a drain of the enhancement-mode pHemt Q1 in the low noise amplifier. When there are two or more diodes, for example, a total of n diodes (n>1), namely, D1, D2, . . . , Dn in FIG. 2, all the diodes are connected in series, where an anode of a first diode D1 is configured to connect to the drain of the enhancement-mode pHemt Q1 in the low noise amplifier, a cathode of the first diode D1 is configured to connect to an anode of a second diode D2, and a cathode of a last diode Dn is configured to connect to the gate of the enhancement-mode pHemt Q1 in the low noise amplifier.

The nonlinear feedback circuit may further include a first resistor R1, as shown in FIG. 2. One end of the first resistor R1 is configured to connect to the cathode of the diode when there is only one diode; one end of the first resistor R1 is configured to connect to the cathode of the last diode when there are two or more diodes; and an other end of the first resistor R1 is configured to be grounded.

The nonlinear feedback circuit may further include a second resistor R2, as shown in FIG. 2. When there is only one diode, the second resistor R2 is connected in series with the diode, one end of the series circuit consisting of the second resistor R2 and the diode is configured to connect to the drain of the enhancement-mode pHemt Q1 in the low noise amplifier, and an other end of the series circuit consisting of the second resistor R2 and the diode is configured to connect to the gate of the enhancement-mode pHemt Q1 in the low noise amplifier; and when there are two or more diodes, the second resistor R2 is connected in series with all the diodes, and one end of the series circuit consisting of the second resistor R2 and all the diodes is configured to connect to the drain of the enhancement-mode pHemt Q1 in the low noise amplifier, and an other end of the series circuit consisting of the second resistor R2 and all the diodes is configured to connect to the gate of the enhancement-mode pHemt Q1 in the low noise amplifier.

The nonlinear feedback circuit may further include a third resistor R3, as shown in FIG. 2. When there is only one diode, one end of the third resistor R3 is configured to connect to the cathode of the diode; when there are two or more diodes, one end of the third resistor R3 is configured to connect to the cathode of the last diode; and an other end of the third resistor R3 is configured to connect to the gate of the enhancement-mode pHemt Q1 in the low noise amplifier.

The nonlinear feedback circuit may further include a first inductor L1, as shown in FIG. 2. When there is only one diode, one end of the first inductor L1 is configured to connect to the anode of the diode; when there are two or more diodes, one end of the first inductor L1 is configured to connect to the anode of the first diode; and an other end of the first inductor L1 is configured to connect to the drain of the enhancement-mode pHemt Q1 in the low noise amplifier.

The nonlinear feedback circuit may further include a first capacitor C1, as shown in FIG. 2. When there is only one diode, one end of the first capacitor C1 is configured to connect to the anode of the diode; when there are two or more diodes, one end of the first capacitor C1 is configured to connect to the anode of the first diode; and an other end of the first capacitor C1 is configured to be grounded.

The nonlinear feedback circuit may further include a second capacitor C2. When there is only one diode, one end of the second capacitor C2 is configured to connect to the cathode of the diode; when there are two or more diodes, one end of the second capacitor C2 is configured to connect to the cathode of the last diode; and an other end of the second capacitor C2 is configured to be grounded.

A specific embodiment of the invention also discloses a low noise amplifier using the nonlinear feedback circuit described above, which, as shown in FIG. 2, includes an enhancement-mode pHemt Q1, where a gate of the enhancement-mode pHemt Q1 is configured to connect to at least one diode: when there is only one diode, a cathode of the diode is connected to the gate of the enhancement-mode pHemt Q1, and an anode of the diode and a drain of the enhancement-mode pHemt Q1 are both connected to one end of a voltage source DC1; when there are two or more diodes, an anode of a first diode and the drain of the enhancement-mode pHemt Q1 are both configured to connect to one end of the voltage source DC1, a cathode of the first diode is configured to connect to an anode of a second diode, and a cathode of a last diode is configured to connect to the gate of the enhancement-mode pHemt Q1; and a source of the enhancement-mode pHemt Q1 and an other end of the voltage source DC1 are both configured to be grounded.

The low noise amplifier may further include a first resistor R1, as shown in FIG. 2. One end of the first resistor R1 is configured to connect to the cathode of the diode when there is only one diode; one end of the first resistor R1 is configured to connect to the cathode of the last diode when there are two or more diodes; and an other end of the first resistor R1 is configured to be grounded.

The low noise amplifier may further include a second resistor R2, as shown in FIG. 2. When there is only one diode, the second resistor R2 is connected in series with the diode, one end of the series circuit consisting of the second resistor R2 and the diode is configured to connect to the drain of the enhancement-mode pHemt Q1 in the low noise amplifier, and an other end of the series circuit consisting of the second resistor R2 and the diode is configured to connect to the gate of the enhancement-mode pHemt Q1 in the low noise amplifier; and when there are two or more diodes, the second resistor R2 is connected in series with all the diodes, and one end of the series circuit consisting of the second resistor R2 and all the diodes is configured to connect to the drain of the enhancement-mode pHemt Q1 in the low noise amplifier, and an other end of the series circuit consisting of the second resistor R2 and all the diodes is configured to connect to the gate of the enhancement-mode pHemt Q1 in the low noise amplifier.

The low noise amplifier may further include a third resistor R3, as shown in FIG. 2. When there is only one diode, one end of the third resistor R3 is configured to connect to the cathode of the diode; when there are two or more diodes, one end of the third resistor R3 is configured to connect to the cathode of the last diode; and an other end of the third resistor R3 is configured to connect to the gate of the enhancement-mode pHemt Q1.

The low noise amplifier may further include a first inductor L1, as shown in FIG. 2. When there is only one diode, one end of the first inductor L1 is configured to connect to the anode of the diode; when there are two or more diodes, one end of the first inductor L1 is configured to connect to the anode of the first diode; and an other end of the first inductor L1 is configured to connect to the drain of the enhancement-mode pHemt Q1.

The low noise amplifier may further include a first capacitor C1, as shown in FIG. 2. When there is only one diode, one end of the first capacitor C1 is configured to connect to the anode of the diode; when there are two or more diodes, one end of the first capacitor C1 is configured to connect to the anode of the first diode; and an other end of the first capacitor C1 is configured to be grounded.

The low noise amplifier may further include a second capacitor C2, as shown in FIG. 2. When there is only one diode, one end of the second capacitor C2 is configured to connect to the cathode of the diode; when there are two or more diodes, one end of the second capacitor C2 is configured to connect to the cathode of the last diode; and an other end of the second capacitor C2 is configured to be grounded.

Of course, the low noise amplifier may further include an input matching circuit connected to the gate of the enhancement-mode pHemt Q1, and may also further include an output matching circuit connected to the drain of the enhancement-mode pHemt Q1, as shown in FIG. 2.

The number of diodes can be adjusted according to actual circuit needs, so that the circuit generates an appropriate voltage drop, to ensure that Vg of the enhancement-mode pHemt Q1 is the same as expected at room temperature. For example, a diode can provide a voltage drop of about 0.9 V. As the temperature increases, the voltage drop decreases, and the change is 0.1 V-0.2 V, exhibiting obvious negative temperature characteristics. The temperature change of the second resistor R2 is reverse to that of the diode. As the temperature increases, the resistance increases, that is, the voltage drop provided increases, exhibiting positive temperature characteristics. In addition, the voltage drop of the second resistor R2 changes with temperature in a small range, which can fine-tune and supplement the temperature change of the diode. During designing, first a number of diodes may be selected roughly according to a required voltage drop, for example, four diodes are selected for 4 V. Then the second resistor R2 is added for fine-tuning and supplementation. If the temperature compensation caused by the diode is found to be too large, the number of diodes may be reduced or the resistance of the second resistor R2 may be increased. The resistance of the first resistor R1 can directly affect the DC current on the feedback circuit and Vg of the enhancement-mode pHemt Q1, and needs to be coordinated with the second resistor R2 for simulation and debugging. It is necessary to refer to the change of OIP3 during simulation, and voltage-current waveforms can be extracted from the feedback circuit to ensure that OIP3 can also achieve a good compensation effect in link adjustment.

Figure 3:
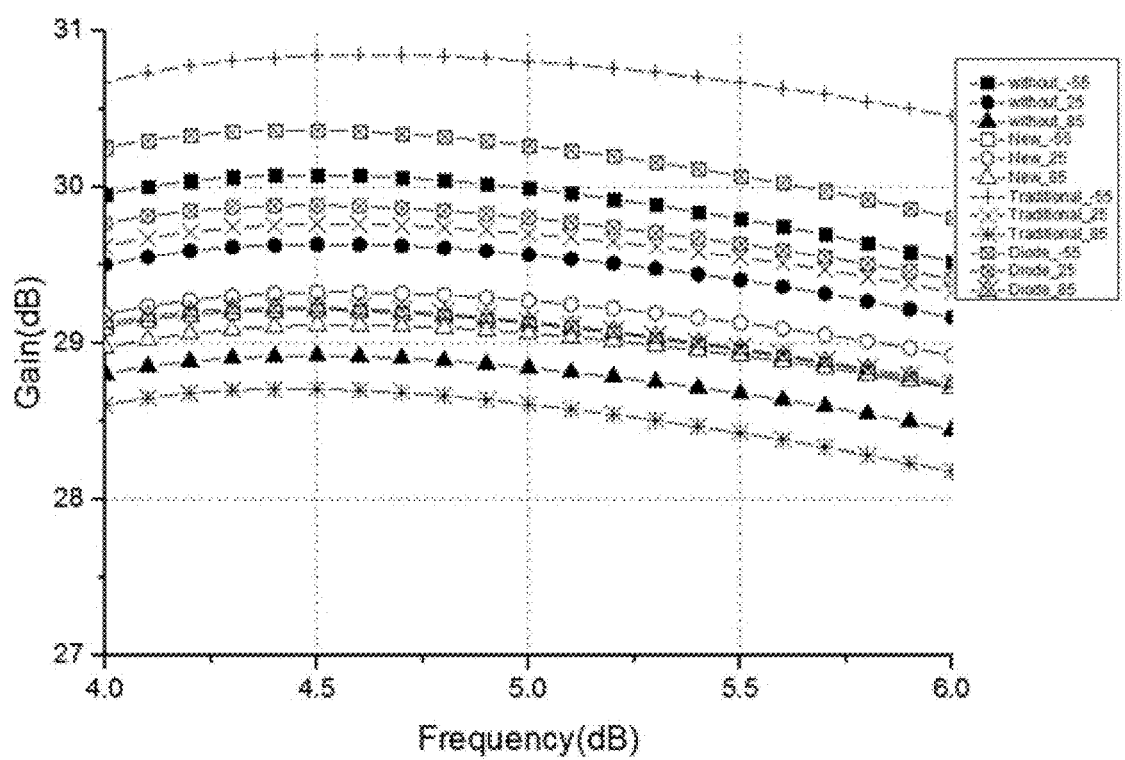
FIG. 3 is a graph of the relationship between gain and frequency in various situations in specific embodiments of the present invention.

FIG. 3 is a graph of the relationship between gain and frequency in various situations in specific embodiments of the present invention. In the figure, "without_-55" represents a gain of the low noise amplifier at -55° C. when none of the first resistor R1, the second resistor R2, and all the diodes is used, "without_25" represents a gain of the low noise amplifier at 25° ° C. when none of the first resistor R1, the second resistor R2, and all the diodes is used, "without_85" represents a gain of the low noise amplifier at 85° C. when none of the first resistor R1, the second resistor R2, and all the diodes is used, "New_-55" represents a gain of the low noise amplifier at -55° C. when the first resistor R1, the second resistor R2, and all the diodes are used, "New_25" represents a gain of the low noise amplifier at 25° C. when the first resistor R1, the second resistor R2, and all the diodes are used, "New_85" represents a gain of the low noise amplifier at 85° C. when the first resistor R1, the second resistor R2, and all the diodes are used, "Traditional_-55" represents a gain of the low noise amplifier at -55° C. when the temperature compensation circuit in FIG. 1 is used in the low noise amplifier, "Traditional_25" represents a gain of the low noise amplifier at 25° ° C. when the temperature compensation circuit in FIG. 1 is used in the low noise amplifier, and "Traditional_85" represents a gain of the low noise amplifier at 85° C. when the temperature compensation circuit in FIG. 1 is used in the low noise amplifier. "Diode_-55" represents a gain of the low noise amplifier at -55° C. when the first resistor R1 and the second resistor R2 are not used and only the diode(s) is used, "Diode_25" represents a gain of the low noise amplifier at 25° C. when the first resistor R1 and the second resistor R2 are not used and only the diode(s) is used, and "Diode_85" represents a gain of the low noise amplifier at 85° C. when the first resistor R1 and the second resistor R2 are not used and only the diode(s) is used. It can be seen that when none of the first resistor R1, the second resistor R2, and all the diodes is used, a gain difference between high and low temperatures is about 1.2 dB. After the first resistor R1, the second resistor R2, and all the diodes are added, the gain difference between high and low temperatures is about 0.2 dB, which maintains to a great extent the consistency of the gain of the low noise amplifier at high and low temperatures. After the diode(s) is added, the gain difference between high and low temperatures is about 1 dB. When the temperature compensation circuit in FIG. 1 is used in the low noise amplifier, the gain difference between high and low temperatures is about 2.5 dB. It can be seen that after the first resistor R1, the second resistor R2, and all the diodes are added, the gain difference of the low noise amplifier between high and low temperatures is reduced greatly. When the first resistor R1 and the second resistor R2 are not used and only the diode(s) is used, the gain difference of the low noise amplifier between high and low temperatures is also reduced much.

Figure 4:
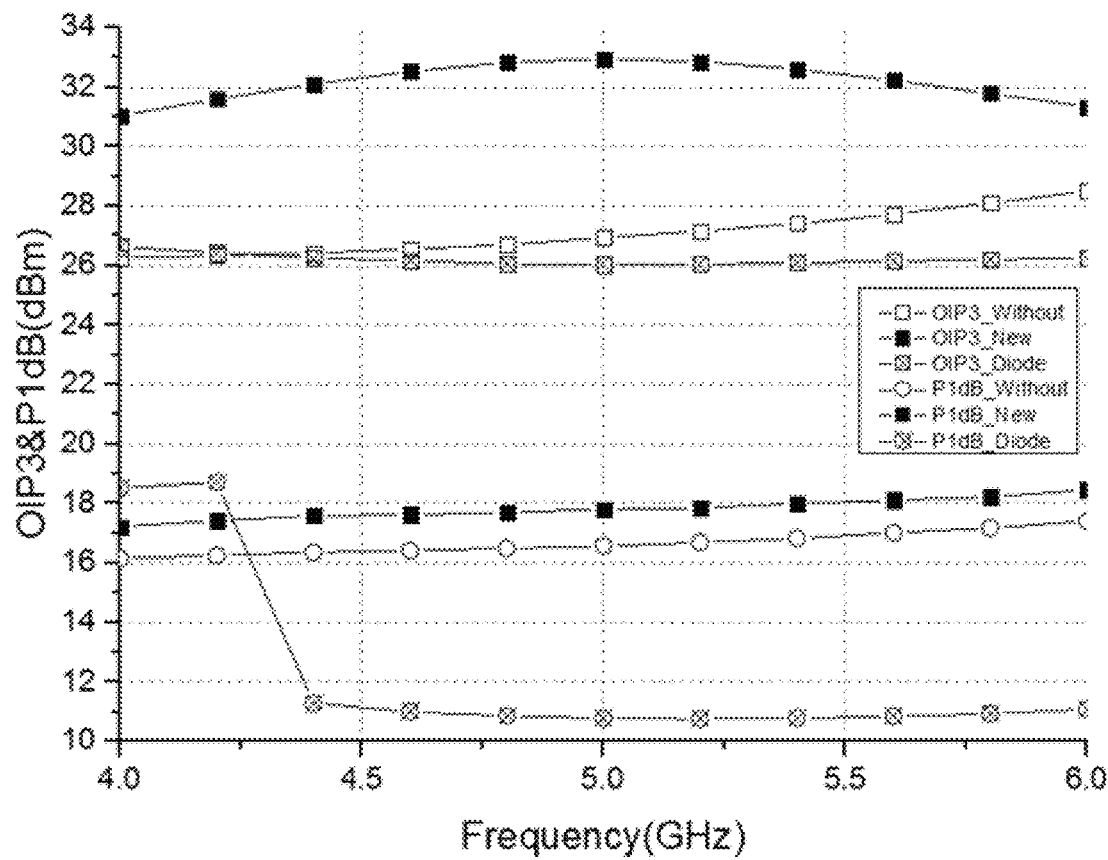
FIG. 4 is a graph of the relationship between OIP3, P1$d$B, and frequency in various situations in specific embodiments of the present invention.

FIG. 4 is a graph of the relationship between OIP3, P1dB, and frequency in various situations in specific embodiments of the present invention. In the figure, "OIP3_Without" represents OIP3 of the low noise amplifier when none of the first resistor R1, the second resistor R2, and all the diodes is used, "OIP3_New" represents OIP3 of the low noise amplifier when the first resistor R1, the second resistor R2, and all the diodes are used, "OIP3_Diode" represents OIP3 of the low noise amplifier when the first resistor R1 and the second resistor R2 are not used and only the diode(s) is used, "P1dB_Without" represents P1dB of the low noise amplifier when none of the first resistor R1, the second resistor R2, and all the diodes is used, "P1dB_New" represents P1dB of the low noise amplifier when the first resistor R1, the second resistor R2, and all the diodes are used, and "P1dB_Diode" represents P1dB of the low noise amplifier when the first resistor R1 and the second resistor R2 are not used and only the diode(s) is used. It can be seen that when none of the first resistor R1, the second resistor R2, and all the diodes is used, the output OIP3 of the low noise amplifier is about 26-28.7 dBm, and OIP3 is 10 dB higher than P1dB. After the first resistor R1, the second resistor R2, and all the diodes are used, the output OIP3 of the low noise amplifier is about 31-33 dBm, which is 3-7 dB higher than that in the case where none of the first resistor R1, the second resistor R2, and all the diodes is used; and OIP3 is 14 dB higher than P1dB, indicating a very significant increase. When the first resistor R1 and the second resistor R2 are not used and only the diode(s) is used, the output OIP3 of the low noise amplifier is about 26 dBm, which is approximately the same as that in the case where none of the first resistor R1, the second resistor R2, and all the diodes is used; and OIP3 is 14 dB higher than P1dB, indicating a relatively large increase. In addition, it can be seen that after the addition of R1 and R2, P1dB of P1dB_New is 8 dB higher than that of P1dB_Diode at high frequencies. The reason lies in that if diodes are used alone and neither of R1 and R2 is used, a large number of diodes are required, which leads to an excessively large parasitic capacitance and capacitive feedback, reducing the P1dB of the chip.

What is claimed is:

1. A nonlinear feedback circuit, comprising a second resistor R2, a first capacitor C1, a second capacitor C2 and at least one diode;

wherein when there is only one diode, a cathode of the diode is configured to connect to a gate of an enhancement-mode pseudomorphic high electron mobility transistor (pHemt) Q1 in a low noise amplifier, and an anode of the diode is configured to connect to a drain of the enhancement-mode pHemt Q1 in the low noise amplifier; the second resistor R2 is connected in series with the diode to form a first series circuit, one end of the first series circuit consisting of the second resistor R2 and the diode is configured to connect to the drain of the enhancement-mode pHemt Q1 in the low noise amplifier, and the other end of the first series circuit consisting of the second resistor R2 and the diode is configured to connect to the gate of the enhancement-mode pHemt Q1 in the low noise amplifier; and one end of the first capacitor C1 is configured to connect to the anode of the diode, and one end of the second capacitor C2 is configured to connect to the cathode of the diode;

and when there are two or more diodes, all the diodes are connected in series, wherein an anode of a first diode is configured to connect to the drain of the enhancement-mode pHemt Q1 in the low noise amplifier, a cathode of the first diode is configured to connect to an anode of a second diode, and a cathode of a last diode is configured to connect to the gate of the enhancement-mode pHemt Q1 in the low noise amplifier; the second resistor R2 is connected in series with all the diodes to form a second series circuit, one end of the second series circuit consisting of the second resistor R2 and all the diodes is configured to connect to the drain of the enhancement-mode pHemt Q1 in the low noise amplifier, and the other end of the second series circuit consisting of the second resistor R2 and all the diodes is configured to connect to the gate of the enhancement-mode pHemt Q1 in the low noise amplifier; and one end of the first capacitor C1 is configured to connect to the anode of the first diode, one end of the second capacitor C2 is configured to connect to the cathode of the last diode; and the other end of the first capacitor C1 and the other end of the second capacitor C2 are both configured to be grounded.

2. The nonlinear feedback circuit of claim 1, further comprising a first resistor R1, wherein one end of the first resistor R1 is configured to connect to the cathode of the diode when there is only one diode; one end of the first resistor R1 is configured to connect to the cathode of the last diode when there are two or more diodes; and the other end of the first resistor R1 is configured to be grounded.

3. The nonlinear feedback circuit of claim 1, further comprising a third resistor R3 and a first inductor L1, wherein when there is only one diode, one end of the third resistor R3 is configured to connect to the cathode of the diode, and one end of the first inductor L1 is configured to connect to the anode of the diode; when there are two or more diodes, one end of the third resistor R3 is configured to connect to the cathode of the last diode, and one end of the first inductor L1 is configured to connect to the anode of the first diode; and the other end of the third resistor R3 is configured to connect to the gate of the enhancement-mode pHemt Q1 in the low noise amplifier, and the other end of the first inductor L1 is configured to connect to the drain of the enhancement-mode pHemt Q1 in the low noise amplifier.

4. A low noise amplifier using a nonlinear feedback circuit, comprising the nonlinear feedback circuit, an enhancement-mode pseudomorphic high electron mobility transistor (pHemt) Q1 and a voltage source DC1, wherein the nonlinear feedback circuit comprises a second resistor R2, a first capacitor C1, a second capacitor C2 and at least one diode, and a gate of the enhancement-mode pHemt Q1 is configured to connect to at least one diode:

when there is only one diode, a cathode of the diode is configured to connect to the gate of the enhancement-mode pHemt Q1, and an anode of the diode is configured to connect to a drain of the enhancement-mode pHemt Q1, the anode of the diode and the drain of the enhancement-mode pHemt Q1 are both configured to connect to one end of the voltage source DC1; the second resistor R2 is connected in series with the diode to form a first series circuit, one end of the first series circuit consisting of the second resistor R2 and the diode is configured to connect to the drain of the enhancement-mode pHemt Q1 in the low noise amplifier, and the other end of the first series circuit consisting of the second resistor R2 and the diode is configured to connect to the gate of the enhancement-mode pHemt Q1 in the low noise amplifier; and one end of the first capacitor C1 is configured to connect to the anode of the diode, and one end of the second capacitor C2 is configured to connect to the cathode of the diode;

and when there are two or more diodes, all the diodes are connected in series, an anode of a first diode is configured to connect to the drain of the enhancement-mode pHemt Q1, and a cathode of a last diode is configured to connect to the gate of the enhancement-mode pHemt Q1; the anode of the first diode and the drain of the enhancement-mode pHemt Q1 are both configured to connect to one end of the voltage source DC1, a cathode of the first diode is configured to connect to an anode of a second diode, and the cathode of the last diode is configured to connect to the gate of the enhancement-mode pHemt Q1; a source of the enhancement-mode pHemt Q1 and the other end of the voltage source DC1 are both configured to be grounded; the second resistor R2 is connected in series with all the diodes to form a second series circuit, one end of the second series circuit consisting of the second resistor R2 and all the diodes is configured to connect to the drain of the enhancement-mode pHemt Q1 in the low noise amplifier, and the other end of the second series circuit consisting of the second resistor R2 and all the diodes is configured to connect to the gate of the enhancement-mode pHemt Q1 in the low noise amplifier; and one end of the first capacitor C1 is configured to connect to the anode of the first diode, one end of the second capacitor C2 is configured to connect to the cathode of the last diode; and the other end of the first capacitor C1 and the other end of the second capacitor C2 are both configured to be grounded.

5. The low noise amplifier using the nonlinear feedback circuit of claim 4, wherein the nonlinear feedback circuit further comprises a first resistor R1, one end of the first resistor R1 is configured to connect to the cathode of the diode when there is only one diode; one end of the first resistor R1 is configured to connect to the cathode of the last diode when there are two or more diodes; and the other end of the first resistor R1 is configured to be grounded.

6. The low noise amplifier using the nonlinear feedback circuit of claim 4, wherein the nonlinear feedback circuit further comprises a third resistor R3 and a first inductor L1, wherein when there is only one diode, one end of the third resistor R3 is configured to connect to the cathode of the diode, and one end of the first inductor L1 is configured to connect to the anode of the diode; when there are two or more diodes, one end of the third resistor R3 is configured to connect to the cathode of the last diode, and one end of the first inductor L1 is configured to connect to the anode of the first diode; and an other end of the third resistor R3 is configured to connect to the gate of the enhancement-mode pHemt Q1, and the other end of the first inductor L1 is configured to connect to the drain of the enhancement-mode pHemt Q1.

\* \* \* \* \*